US008970780B2

(12) United States Patent
Wang

(10) Patent No.: US 8,970,780 B2
(45) Date of Patent: Mar. 3, 2015

(54) CAMERA MODULE HAVING IMAGE SENSOR AND COVER GLASS

(71) Applicant: Hong-Kun Wang, New Taipei (TW)

(72) Inventor: Hong-Kun Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 13 days.

(21) Appl. No.: 13/660,032

(22) Filed: Oct. 25, 2012

(65) Prior Publication Data
US 2014/0055668 A1 Feb. 27, 2014

(30) Foreign Application Priority Data
Aug. 22, 2012 (TW) .............................. 101130404 A

(51) Int. Cl.
H04N 5/225 (2006.01)
(52) U.S. Cl.
USPC .......................................................... 348/374
(58) Field of Classification Search
CPC . H04N 5/2251; H04N 5/2252; H04N 5/2253; H04N 5/2254
USPC .......................................................... 348/33
See application file for complete search history.

(56) References Cited

U.S. PATENT DOCUMENTS

| 5,606,194 A * | 2/1997 | Lebrun et al. ................. 257/433 |
| 2002/0074566 A1* | 6/2002 | Ker et al. ....................... 257/200 |
| 2006/0009029 A1* | 1/2006 | Hua et al. ....................... 438/637 |
| 2008/0024883 A1* | 1/2008 | Iwasaki ........................ 359/808 |
| 2009/0032925 A1* | 2/2009 | England ........................ 257/680 |
| 2009/0075426 A1* | 3/2009 | Shen et al. ..................... 438/109 |
| 2009/0079863 A1* | 3/2009 | Aoki et al. ..................... 348/374 |
| 2013/0032942 A1* | 2/2013 | Sasaki et al. .................. 257/738 |
| 2013/0271649 A1* | 10/2013 | Halliday ........................ 348/374 |

* cited by examiner

Primary Examiner — Timothy J Henn
(74) Attorney, Agent, or Firm — Novak Druce Connolly Bove + Quigg LLP

(57) ABSTRACT

A camera module includes an image sensor, a number of metal balls, and a cover glass. The image sensor includes an active surface and a number of pads. The active surface includes an imaging zone and a non-imaging zone surrounding the imaging zone. The imaging zone is configured to sense incident light and to convert the incident light into corresponding electric signals. The pads are formed on the non-imaging zone. The metal balls are stacked on three of the pads, which are not linear. The numbers of the metal balls on each of the three pads are equal to each other such that heights of the metal balls on each of the three pads are substantially equal to each other. The cover glass is positioned on the metal balls.

8 Claims, 2 Drawing Sheets

CAMERA MODULE HAVING IMAGE SENSOR AND COVER GLASS

BACKGROUND

1. Technical Field

The present disclosure relates to camera modules and, particularly to a camera module with an image sensor and a cover glass for covering the image sensor.

2. Description of Related Art

Camera modules include an image sensor and a cover glass. The cover glass is adhered to a non-imaging zone of the image sensor via adhesive, which surrounds an imaging zone of the image sensor, thus sealing the imaging zone. The cover glass may be stained with dust particles. Therefore, it is desired to increase a distance between the cover glass and the image sensor to reduce projections of the dust particles on the imaging zone. Thus, adverse effect of the dust particles on a quality of the image can be reduced. However, this is difficult to achieve as the adhesive can not hold the cover glass sufficient high relative to the image sensor Therefore, it is desirable to provide a camera module, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will now be described in detail with reference to the drawings.

Figure 1:
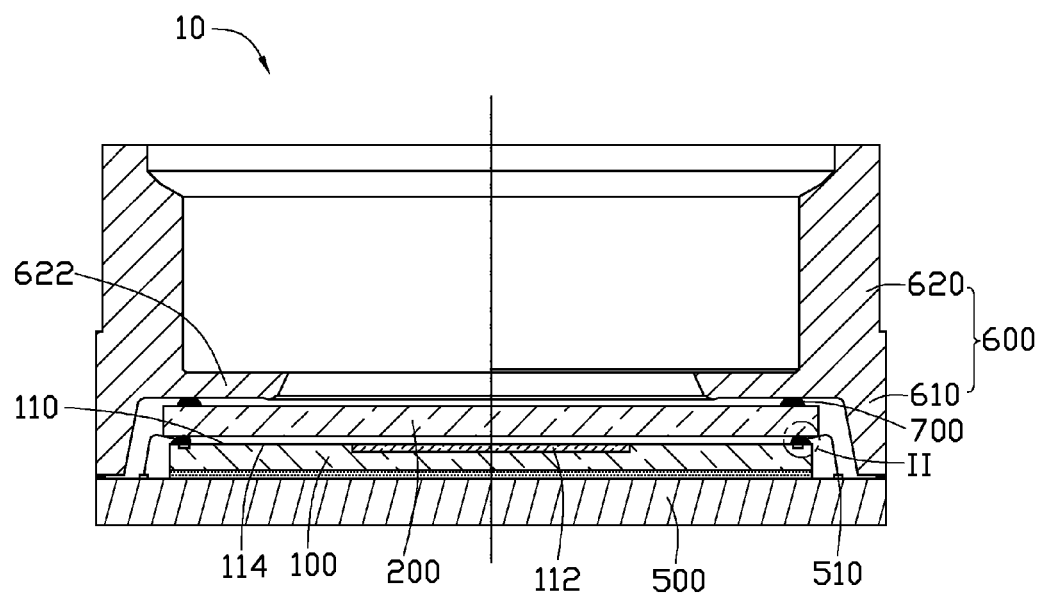
FIG. 1 is a cross-sectional schematic view of a camera module in accordance with an embodiment.
Figure 2:
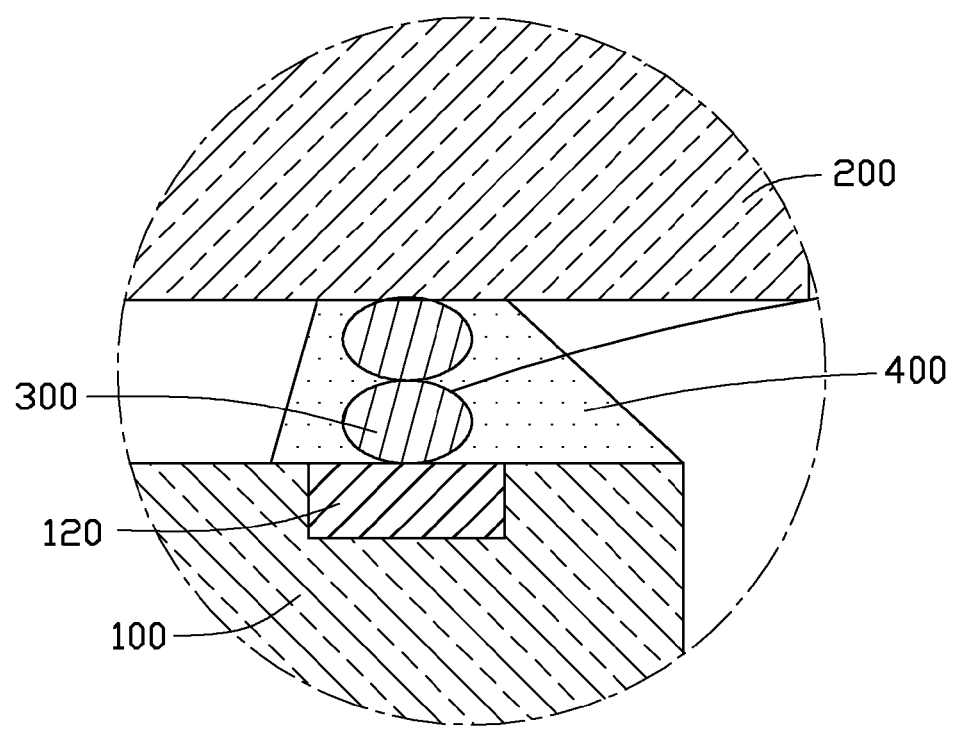
FIG. 2 is an enlarged view of a circled portion II of FIG. 1.

Referring to FIGS. 1-2, a camera module 10, according to an embodiment, includes an image sensor 100 and a cover glass 200. The image sensor 100 includes an active surface 110. The active surface 110 includes an imaging zone 112 and a non-imaging zone 114 surrounding the imaging zone 112. The imaging zone 112 is configured to sense incident light and to convert the incident light into corresponding electric signals. The image sensor 100 includes a number of pads 120 formed in the non-imaging zone 114. The cover glass 200 can be an infrared cut-off filter and positioned above the image sensor 100. The camera module 10 also includes a number of metal balls 300. The metal balls 300 are stacked on three of the pads 120, which are not linear. The numbers of the metal balls 200 on each of the three pads 120 are equal to each other such that heights of the metal balls 300 on each of the three pads 120 are substantially equal to each other. The cover glass 300 is positioned on the metal balls 300.

As such, the metal balls 300 can hold the cover glass 200 to a sufficient height relative to the image sensor 100 to reduce adverse effects of quality of images captured by the image sensor 10 from dust particles on the cover glass 200.

The metal balls 300 can be gold balls and may be stacked by a wire bond technology.

A size (i.e., diameter) of each metal ball 300 is equal to or slightly smaller than a size (i.e., length or width) of each pad 120.

In the embodiment, the number of the metal balls 300 in each of the three pads 120 is two. In other embodiments, the number of metals balls 300 can be changed depending on need. The diameter of the metal balls 300 is about 25 microns. As such, the metal balls 300 can hold the cover glass 200 at least 25 microns relative to the image sensor 100. The distance between the cover glass 200 and the image sensor 100 is increased as compared to those conventional camera modules, in which adhesive typically holds a cover glass less than 10 microns high relative to an image sensor.

The camera module 10 also includes a first sealing adhesive 400 applied to the non-imaging zone 114 and surrounding the imaging zone 112. The first sealing adhesive 400 thus seals the imaging zone 112 to prevent the imaging zone 112 from being stained by dust particles.

The camera module 10 also includes a printed circuit board (PCB) 500. The image sensor 100 is positioned on and electrically connected to the PCB 500. The PCB 500 includes a number of contacts 510, corresponding to the pads 120. The contacts 510 are electrically connected to the pads 120, respectively, via the wire bond technology.

The camera module 10 also includes a lens holder 600. The lens holder 600 is positioned on the PCB 500. The lens holder 600 includes a rectangular section 610 and a circular section 620. The rectangular section 610 is positioned on the PCB 500 and covers the image sensor 100 and the cover glass 200. The circular section 620 extends from the rectangular section 610 and aligns with the imaging zone 112 for receiving a lens (not shown).

The lens holder 600 includes a stop portion 622, which is an annular plate extending inward from the circular section 620, adjacent to the rectangular section 610 and facing the cover glass 200. The camera module 10 also includes a second sealing adhesive 700 applied between the cover class 200 and the stop portion 622, surrounding the imaging portion 112. Thus, the rectangular section 610 is separated from the circular section 620 to reject the dust particles entering into the rectangular section 610 via the circular section 620.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. A camera module, comprising:
   an image sensor comprising an active surface and a plurality of pads, the active surface comprising an imaging zone and a non-imaging zone surrounding the imaging zone, the imaging zone being configured to sense incident light and to convert the incident light into corresponding electric signals, the pads being formed on the non-imaging zone;
   a plurality of metal balls stacked on three of the pads, which are not linear, the numbers of the metal balls on each of the three pads being equal to each other such that heights of the metal balls on each of the three pads are substantially equal to each other;
   a printed circuit board (PCB), the image sensor being positioned on and electrically connected to the PCB, the PCB comprising a plurality of contacts, corresponding to the pads, the three of the pads that are stacked with metal balls being connected to the corresponding contacts by bonding wires, respectively; and
   a cover glass positioned on the metal balls.

2. The camera module of claim 1, wherein the metal balls are gold balls.

3. The camera module of claim 1, wherein the metal balls are stacked by a wire bond technology.

4. The camera module of claim 1, wherein a size of each metal ball is equal to or slightly smaller than a size of each pad.

5. The camera module of claim 1, wherein the diameter of the metal balls is about 25 microns.

6. The camera module of claim 1, wherein the cover glass is an infrared cut-off filter.

7. The camera module of claim 1, further comprising a first sealing adhesive applied to the non-imaging zone and surrounding the imaging zone, sealing the imaging zone.

8. The camera module of claim 1, further comprising a lens holder, the lens holder being positioned on the PCB, the lens holder comprising a rectangular section and a circular section, the rectangular section being positioned on the PCB and covering the image sensor and the cover glass, the circular section extending from the rectangular section and aligning with the imaging zone, the lens holder comprising a stop portion, the stop portion being an annular plate extending inward from the circular section, adjacent to the rectangular section and facing the cover glass, the camera module comprising a second sealing adhesive applied between the cover class and the stop portion, surrounding the imaging portion.

* * * * *